United States Patent [19] [11] 3,846,723
Writer et al. [45] Nov. 5, 1974

[54] SURFACE WAVE NARROW BANDPASS FILTER

[75] Inventors: Philip L. Writer; Maurice L. Schiff, both of San Diego, Calif.

[73] Assignee: The United States of America as represented by the Secretary of the Navy, Washington, D.C.

[22] Filed: June 22, 1973

[21] Appl. No.: 372,560

[52] U.S. Cl. .................................. 333/72, 330/110
[51] Int. Cl. ............................................ H03h 9/00
[58] Field of Search ................ 330/5.5, 110; 333/72

[56] References Cited
UNITED STATES PATENTS

| | | | |
|---|---|---|---|
| 3,550,045 | 12/1970 | Adler | 333/72 |
| 3,582,840 | 6/1971 | DeVries | 333/72 |
| 3,748,603 | 7/1973 | Wojcik | 333/72 |

*Primary Examiner*—John Kominski
*Assistant Examiner*—Darwin R. Hostetter
*Attorney, Agent, or Firm*—R. S. Sciascia; G. J. Rubens

[57] ABSTRACT

A narrow bandpass filter comprising a surface wave device having a transmission characteristic wherein at a selectable center frequency the transmission goes through a very sharp null. The filter is connected in the negative feedback loop of an amplifier circuit. An input signal at the center frequency will not feed back any signal to the input of the amplifier because of the transmission characteristic. As the frequency moves slightly away from the center frequency, the device will begin to transmit.

2 Claims, 4 Drawing Figures

SURFACE WAVE NARROW BANDPASS FILTER

BACKGROUND OF THE INVENTION

Bandpass filters are common components of numerous and varied communications devices and systems such as radio, TV, radar and sonar. Because of varying center frequency and bandpass requirements for such filters, literally hundreds of technologies have been employed in the design thereof. For example, resistors, capacitors and inductors properly connected form the basis for the lumped constant technology. Also, many crystal materials have been known to selectively transmit certain frequencies; thus, the crystal filter technology has been highly developed. Furthermore, even surface wave filters used in a manner different from that disclosed herein have recently been developed. The present invention comprises a surface wave device which is novel in construction and which will be used in a novel and unique manner to be described hereinafter.

SUMMARY OF THE INVENTION

A narrow bandpass filter comprising a surface wave device is disclosed. The device essentially comprises transducers consisting of U-shaped aluminum "fingers" which are deposited on a suitable piezoelectric substrate, such as quartz. An input transducer comprising two interleaved fingers accepts input signals and launches an acoustic Rayleigh surface wave into the substrate at all frequencies except at center frequency $F_o$. The spacing between the fingers of the input transducer determines the center frequency of the device. The surface wave is coupled to an output transducer which comprises two pairs of U-shaped fingers spaced apart an integral number of wavelengths. Each of the two pairs has a reversed sense with respect to the other, whereby the transfer characteristic of the output transducer essentially prevents transmission of the signal at the center frequency.

OBJECTS OF THE INVENTION

It is the general object of the present invention to disclose bandpass filter apparatus operable at center frequencies and having a bandpass not previously possible.

It is a particular and specific object of the present invention to provide such a filter comprising a surface wave device which is connected in the negative feedback loop of an amplifier circuit.

Other objects, advantages and novel features of the invention will become apparent from the following detailed description of the invention when considered in conjunction with the accompanying drawings.

DESCRIPTION OF THE PREFERRED EMBODIMENT

Figures 1, 2:
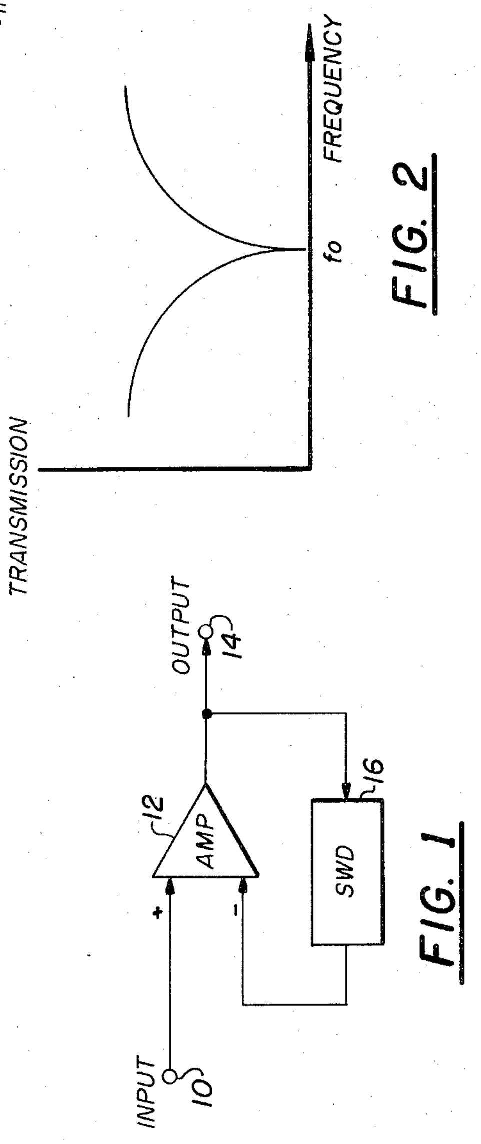
FIG. 1 is a simplified block diagram of an amplifier circuit having a surface wave bandpass filter of the type to be disclosed herein connected in the negative feedback loop.
FIG. 2 is a graphical representation of the transmission characteristic curve of the surface wave device in the feedback loop of FIG. 1.

As stated above, FIG. 1 comprises an amplifier circuit with a negative feedback loop. As can be seen, the feedback loop differs from conventional ones in that a surface wave device of the type to be described hereinafter is connected in the feedback loop of the circuit.

Incoming signals are applied to the input terminal 10 which presents them to the positive terminal of the amplifier 12. The output of the amplifier 12 is obtained at the output terminal 14. The output is also fed back via a negative feedback loop to the surface wave device 16. The output of the surface wave device 16 is connected with negative polarity to the amplifier 12.

Figure 3:
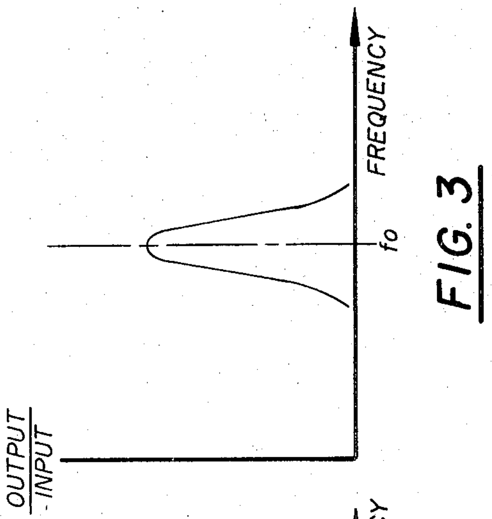
FIG. 3 is a graphical representation of the bandpass characteristics of the device of FIG. 1; and, FIG. 4 is an electrical schematic of the surface wave device of FIG. 1.

As stated previously, amplifier circuits with negative feedback loops are well-known; however, the use of surface wave devices such as 16 in the loop to obtain a transmission characteristic curve as shown in FIG. 2 and a bandpass curve as shown in FIG. 3 is believed to be novel in the art.

Accordingly, attention is directed to the transfer characteristic curve of FIG. 2, and to the bandpass curve of FIG. 3. As shown in FIG. 2, the surface wave device is designed to have a transmission characteristic wherein at a center frequency $f_o$ the transmission goes through a very sharp null; consequently, with reference to FIG. 1, at a frequency $f_o$ the surface wave device 16 will not pass any signals back to the negative terminal of the amplifier 12. Instead, the input signal applied to the terminal 10 will pass directly through the amplifier to the output terminal 14 without any modification thereof by the device 16.

However, as the frequency of operation varies slightly to either side of $f_o$, the device 16 will begin to transmit, that is, it will feed back the signal to the amplifier with negative polarity. This feedback effectively reduces the strength of the signal at the output terminal 14 relative to the strength of the input signal. As can be seen from FIG. 3, the net effect of the device 16, in an operational sense, is to invert the transmission characteristic of the surface wave device 16 into the narrow bandpass characteristic shown in FIG. 3.

Briefly, the surface wave device 16 comprises transducer apparatus and is constructed as follows. Aluminum "fingers" which operate as transducers are deposited on a suitable piezoelectric substrate 22, such as quartz, in a conventional manner well-known to those skilled in the art. Each transducer is U-shaped and comprises two parallel aluminum fingers spaced apart from each other and emanating in a perpendicular manner from a common aluminum base.

Figure 4:
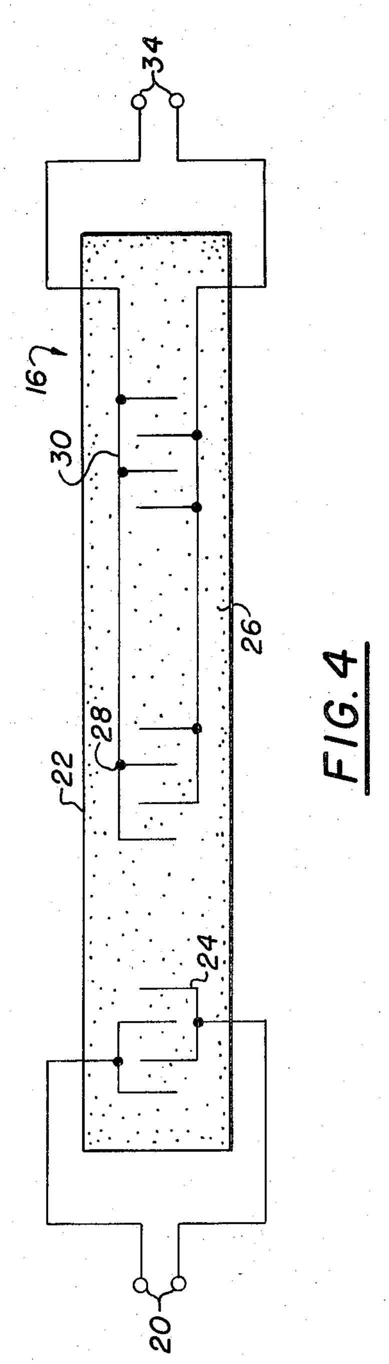

The filter device 16 is provided with input terminals 20 which accept incoming electrical signals. The terminals 20 are connected to an input transducer pair 24 comprising two U-shaped transducers. The signals are entered into the quartz substrate 22 by the action of the transducer 24 which launches an acoustic Rayleigh (surface) wave as shown in FIG. 4. The spacing between the aluminum fingers of the transducer 24 determines the center frequency $f_o$ shown in FIGS. 2 and 3.

The wave which is launched in the device is coupled to an output transducer 26 which comprises two tap elements 28 and 30. The taps 28 and 30 also comprise aluminum fingers and are spaced an integral number of wavelengths ($N\lambda_o$) apart from each other where $\lambda_o$ = velocity/$f_o$.

It should be noted that the two taps 28 and 30 are connected in a reversed sense with respect to each other. That is, tap 28 has its first finger from the top, whereas tap 30 has its first finger from the bottom.

The structure disclosed in FIG. 4, in accordance with established theory of surface wave devices and standard Fourier transforms produces a transfer characteristic, T, at the output 34 which may be written as follows:

$T \approx [1 - e^{2} \quad ^{jN(f/f\ )}]$

If $f = f_o$, then $T = 0$, and the general shape of the bandpass curve near $f_o$ is as indicated in the graphical representation of FIG. 2.

In summary, novel bandpass filter apparatus are disclosed which advance the state of the art by virtue of center frequency and bandwidth which can be achieved. Generally speaking, the disclosed device is operable in a frequency range of, for example, from 10-MHz to 2-GHz, as determined by the spacing of the fingers of the transducer 24 as indicated in the discussion of FIG. 4. Furthermore, the bandwidth is independent of the center frequency and is determined by amount of separation $N\lambda_o$ between the taps 28 and 30.

The achievable bandwidth with the disclosed apparatus is less than 10-KHz. It can be appreciated that the combinations of frequency and bandwidth obtainable are not feasible utilizing any other existing technology presently known. Ancillary benefits reside in the simplicity and low-cost and reliability of these devices.

It should further be appreciated that different piezoelectric materials such as lithium niobate could be employed advantageously within the disclosed concept. The choice of material should be finally optimized and will depend on any second order effects. The actual piezoelectric material selected, however, is not a critical part of the concept. Furthermore the output transducer 30 of FIG. 4 could be designed in several ways to accomplish the effect of the sharp transmission null.

Thus it can be seen that a new and novel narrow bandpass filter has been disclosed. Obviously many modifications are possible in the light of the above teachings. It is therefore to be understood that within the scope of the appended claims the invention may be practiced otherwise than as specifically described.

What is claimed is:

1. Bandpass filter apparatus comprising:

an acoustic-wave propagating medium;

a first pair of electrically conductive, U-shaped members deposited on said medium in a symmetrical, interleaved manner with respect to each other and being responsive to incoming signals to launch acoustic waves in said medium at frequencies on either side of a center frequency $f_o$, and to launch no acoustic waves at said frequency $f_o$;

second and third pairs of U-shaped members deposited on said medium and spaced apart from said first pair and disposed thereon in an in-line and parallel manner with respect to said first pair, said second and third pairs being electrically connected to each other in a polarity-reversed sense and further being spaced from each other an integral number of wavelengths, $N\lambda_o$, where N is equal to any integer and $\lambda_o = V_o/f_o$; and, terminal means connected to the output of said third pair for providing an output signal having a bandwidth proportional said number of wavelengths, $N\lambda_o$.

2. The apparatus of claim 1 wherein said propagating medium comprises quartz and wherein said members comprise aluminum devices.

* * * * *